(12) United States Patent
Hartensveld et al.

(10) Patent No.: US 11,011,571 B2
(45) Date of Patent: May 18, 2021

(54) NANOWIRE LIGHT EMITTING SWITCH DEVICES AND METHODS THEREOF

(71) Applicant: Innovation Semiconductor, Rochester, NY (US)

(72) Inventors: Matthew Hartensveld, Wyckoff, NJ (US); Jing Zhang, Pittsford, NY (US)

(73) Assignee: INNOVATION SEMICONDUCTOR, Rochester, NY (US)

( * ) Notice: Subject to any disclaimer, the term of this patent is extended or adjusted under 35 U.S.C. 154(b) by 0 days.

(21) Appl. No.: 16/548,377

(22) Filed: Aug. 22, 2019

(65) Prior Publication Data

US 2020/0066786 A1  Feb. 27, 2020

Related U.S. Application Data

(60) Provisional application No. 62/722,268, filed on Aug. 24, 2018.

(51) Int. Cl.
  H01L 27/15  (2006.01)
  H01L 29/06  (2006.01)
  (Continued)

(52) U.S. Cl.
  CPC .......... H01L 27/15 (2013.01); H01L 29/0676 (2013.01); H01L 29/2003 (2013.01); H01L 29/42392 (2013.01); H01L 29/454 (2013.01); H01L 29/66522 (2013.01); H01L 29/66742 (2013.01); H01L 29/78642 (2013.01);
  (Continued)

(58) Field of Classification Search
  CPC . H01L 27/15; H01L 29/0676; H01L 29/2003; H01L 29/42392; H01L 29/454; H01L 29/66522; H01L 29/66742; H01L 29/78642; H01L 29/78681; H01L 29/78696; H01L 33/0075; H01L 33/06; H01L 33/24; H01L 33/32; H01L 33/42; H01L 33/50; H01L 2933/0016; H01L 2933/0041
  See application file for complete search history.

(56) References Cited

U.S. PATENT DOCUMENTS 8,350,251 B1   1/2013  Lowgren et al.
8,624,968 B1   1/2014  Hersee et al.
(Continued)

FOREIGN PATENT DOCUMENTS

WO   2017046015   3/2017
WO   2019147589   8/2019

OTHER PUBLICATIONS

Motayed et al., "Gallium Nitride Nanowire Devices—Fabrication, Characterization, and Transport Properties", ISDRS 2007, Dec. 12-14, 2007, College Park, MD, USA.
(Continued)

*Primary Examiner* — Peniel M Gumedzoe
(74) *Attorney, Agent, or Firm* — Troutman Pepper Hamilton Sanders LLP (Rochester)

(57) ABSTRACT

A nanowire system includes a substrate and at least one nanowire structure which extends out along an axis from a surface of the substrate. The nanowire structure comprises a light emitting diode and a device driver electrically coupled to control an operational state of the light emitting diode. The light emitting diode and the device driver are integrated to each share at least one doped region.

14 Claims, 5 Drawing Sheets

(51) Int. Cl.
| | |
|---|---|
| H01L 29/20 | (2006.01) |
| H01L 29/423 | (2006.01) |
| H01L 29/45 | (2006.01) |
| H01L 29/786 | (2006.01) |
| H01L 33/06 | (2010.01) |
| H01L 33/24 | (2010.01) |
| H01L 33/32 | (2010.01) |
| H01L 33/42 | (2010.01) |
| H01L 33/50 | (2010.01) |
| H01L 33/00 | (2010.01) |
| H01L 29/66 | (2006.01) |

(52) U.S. Cl.
CPC .. *H01L 29/78681* (2013.01); *H01L 29/78696* (2013.01); *H01L 33/0075* (2013.01); *H01L 33/06* (2013.01); *H01L 33/24* (2013.01); *H01L 33/32* (2013.01); *H01L 33/42* (2013.01); *H01L 33/50* (2013.01); *H01L 2933/0016* (2013.01); *H01L 2933/0041* (2013.01)

(56) References Cited

U.S. PATENT DOCUMENTS

| | | | |
|---|---|---|---|
| 8,791,470 | B2 | 7/2014 | Wober |
| 9,106,056 | B1 | 8/2015 | Hersee |
| 9,768,350 | B2 | 9/2017 | Bavencove et al. |
| 9,941,329 | B2 | 4/2018 | Nayak et al. |
| 2003/0146711 | A1 | 8/2003 | Tsujimura et al. |
| 2003/0168964 | A1 | 9/2003 | Chen |
| 2006/0237537 | A1 | 10/2006 | Empedocles et al. |
| 2006/0273328 | A1 | 12/2006 | Niu et al. |
| 2007/0228421 | A1 | 10/2007 | Shioya et al. |
| 2008/0149944 | A1 | 6/2008 | Samuelson et al. |
| 2008/0251780 | A1 | 10/2008 | Li et al. |
| 2009/0267049 | A1 | 10/2009 | Cho et al. |
| 2011/0254034 | A1 | 10/2011 | Konsek et al. |
| 2011/0309382 | A1 | 12/2011 | Lowgren |
| 2012/0037883 | A1* | 2/2012 | Jiang ................. H01L 25/0753 257/13 |
| 2012/0326119 | A1 | 12/2012 | Ju et al. |
| 2014/0138620 | A1 | 5/2014 | Svensson et al. |
| 2015/0108479 | A1 | 4/2015 | Brinkley et al. |
| 2016/0035814 | A1 | 2/2016 | Jin et al. |
| 2016/0104743 | A1* | 4/2016 | Tchelnokov .......... H01L 33/385 257/91 |
| 2017/0323788 | A1 | 11/2017 | Mi et al. |
| 2017/0323925 | A1* | 11/2017 | Schneider, Jr. ....... H01L 27/156 |
| 2017/0338276 | A1 | 11/2017 | Nayak et al. |
| 2019/0006413 | A1* | 1/2019 | Jacob ................. H01L 29/0847 |

OTHER PUBLICATIONS

Guerfi et al., "Vertical Silicon Nanowire Field Effect Transistors with Nanoscale Gate-All-Around", Nanoscale Research Letters, 2016.

Sabui et al., "GaN Nanowire Schottky Barrier Diodes" IEEE Transactions on Electron Devices, vol. 64, No. 5, pp. 2283-2290, May 2017.

Nami et al., "Carrier Dynamics and Electro-Optical Characterization of High-Performance GaN/InGaN Core-Shell Nanowire Light-Emitting Diodes", Scientific Reports, vol. 8, No. 501, 2017.

Fatahilah et al., "3D GaN Nanoarchitecture for Field-Effect Transistors", Micro and Nano Engineering, vol. 3, pp. 59-81, 2019.

"A Micro-LED Display Patent was Published in Europe This Month That Could Apply to Future iDevices, Macs & More", retrieved from the internet: https://www.patentlyapple.com/patently-apple/2019/08/a-micro-led-display-patent-was-published-in-europe-this-month-that-could-apply-to-future-idevices-macs-more.html, (2019).

"Nanowire Light Emitting Diode Integrated with Field Effect Transistor", Rochester Institute of Technology, Feb. 27, 2019.

"Nanowire Light Emitting Diode Integrated with Field Effect Transistor", Rochester Institute of Technology, Aug. 30, 2018.

Tsuchiyama et al. "Monolithic integration of Si-MOSFET and GaNLED using Si/SiO2/GaN-LED wafer", Appl. Phys., vol. 9, 2016.

Atalla et al. "On the design of GaN vertical MESFETs on commercial LED sapphire wafers", Solid-State Electronics, vol. 126, 2016.

Yu et al. "Vertical architecture for enhancement mode power transistors based on GaN nanowires", Appl. Phys. Lett., vol. 108, 2016.

Lee et al. "Monolithic integration of GaN-based lightemitting diodes and metal-oxide-semiconductor field-effect transistors", OSA, vol. 22, 2014.

Im et al. "Fabrication of normally-off GaN nanowire gate-all-around FET with top-down approach", Appl. Phys. Lett., vol. 109, 2016.

Jo et al. "First Demonstration of GaN-based Vertical Nanowire FET with Top-Down Approach", IEEE Device Research Conference, pp. 35-36, 2015.

Shih et al. "Analysis of Active Matrix GaN-Based HFET Switch Circuits Integrated With GaN LED Micro-Displays", IEEE Electron Device Letters, vol. 26, 2005.

Cai et al. "Voltage-Controlled GaN HEMT-LED Devices as Fast-Switching and Dimmable Light Emitters", IEEE Electron Device Letters, vol. 39, 2018.

Liu et al. "Low-Leakage High-Breakdown Laterally Integrated HEMT-LED via n—GaN Electrode", IEEE Photonics Technology Letters, vol. 28, 2016.

Zhang et al. "Directly color-tunable smart display based on a CMOS-controlled micro-LED array, Nanophotonic Assemblies" IEEE Photonics Conference, 2012.

Huang et al. "Nanowires for Integrated Multicolor Nanophotonics**", Nanophotonic Assemblies, vol. 1, pp. 142-147, 2005.

Deschler et al. "Planar Monolithic Integration of LED and FET Devices on a Conductive Substrate", IEEE Transactions on Electron Devices, vol. ED-34, pp. 2043-2048, 1987.

Wada et al. "Monolithic Integration of an AlGaAs/GaAs DH LED with a GaAs FET Driver", IEEE Electron Device Letters, vol. EDL-3, pp. 305-307, 1982.

Guo et al. "InGaN/GaN disk-in-nanowire white light emitting diodes on (001) silicon", Appl. Phys. Lett., vol. 98, 2011.

Ghosh et al. "Monolithic integration of GaAs lightemitting diodes and Si metaloxidesemiconductor fieldeffect transistors", Appl. Phys. Lett., vol. 48, pp. 370-371, 1986.

International Search Report and Written Opinion for International Application No. PCT/US19/47707; dated Feb. 20, 2020; 10 pages.

* cited by examiner

NANOWIRE LIGHT EMITTING SWITCH DEVICES AND METHODS THEREOF

This application claims the benefit of U.S. Provisional Patent Application Ser. No. 62/722,268, filed Aug. 24, 2018, which is hereby incorporated by reference in its entirety.

FIELD

This technology generally relates to nanowire structures and, more particularly to nanowire light emitting switch devices and methods thereof.

BACKGROUND

Current display resolution is reaching its practical limitations. To enable advances in pixel density and resolution the Thin-Film Transistors (TFTs) included in displays must be further reduced in size.

Accordingly, the future of display technology may be with nanowire light emitting diodes (LED) which are being pursued due to higher efficiencies (70% vs. 5-7%), higher reliability, and the potential to provide higher pixel densities. With respect to reliability, nanowire LEDs when compared against other currently available technologies are better able to withstand long term operation and higher temperatures because of the material the nanowire LEDs can be made from. However, with respect to higher pixel densities, there has been no easy way to densely integrate nanowire LEDs with transistors (switches) that turn them "on" or "off". Currently available approaches to address this issue sacrifice LED area along as well as device performance thus limiting potential applications.

In particular, previous works on combining transistors with LEDs have relied on approaches that degrade LED performance, consume area, and increase cost. These approaches include methods such as, dedicating an area for the lateral growth of another material to create a High Electron Mobility Transistor (HEMT). Unfortunately, this process leads to reduced LED performance and takes up an undesirable portion of the total device area.

Another approach has tried growth on silicon which is combined with CMOS transistors. Unfortunately, growth on silicon can create defects in the LEDs due to the mismatch of material, which correspondingly degrades performance. Additionally, this approach still struggles with managing temperature variations and still consumes too much area.

Yet another approach has tried flip-chip bonding with LEDs on silicon. With this approach, LEDs are separately fabricated, individually cut out, and then mounted on top of a silicon wafer to combine the LEDs with CMOS transistors on silicon. Unfortunately, this approach has reliability concerns from the hundreds of separate LEDs that need to be connected together, along with the inability to shrink in size past existing technology.

SUMMARY

A nanowire system comprising a substrate and at least one nanowire structure which extends out along an axis from a surface of the substrate. The nanowire structure comprises a light emitting diode and a device driver electrically coupled to control an operational state of the light emitting diode. The light emitting diode and the device driver are integrated to each share at least one doped region.

A method of making a nanowire system includes providing a substrate and forming at least one nanowire structure which extends out along an axis from a surface of the substrate. The nanowire structure comprises a light emitting diode and a device driver electrically coupled to control an operational state of the light emitting diode. The light emitting diode and the device driver are integrated to each share at least one doped region.

This technology provides a number of advantages including providing one or more energy efficient and reliable nanowire light emitting switch devices whose single axis oriented and integrated shared layer structure enables a high pixel density array to be easily fabricated. In particular, examples of the claimed technology makes novel use of GaN, a material common in the light emitting layers of LED structures, but not in layers of a transistor that switch the LED structures on and off. With these GaN-based examples of the nanowire light emitting switch devices, energy efficiencies of up to about 70% can be obtained compared with energy efficiencies of about 5-7% found with prior technologies. These energy efficiency gains enable a huge reduction in power consumption and as a result also substantially extend battery life. Further, these and other examples of the nanowire light emitting switch devices are able to achieve pixel cross sections in the low single digit micron range, with the potential to realize even higher resolutions, enabling display resolutions that are orders of magnitude greater than prior existing displays.

Additionally, examples of the claimed technology achieve a true monolithic nanowire light emitting switch device using a single semiconductor material system. The unique structure of this nanowire light emitting switch device, which shares at least one layer between the LED and the device driver, has fewer layers than prior LED structures that required multiple layers and space consuming layouts. Additionally, these examples of the claimed technology enable a much simpler manufacturing process than required for multi-material LED's, with fewer steps and the ability to form all functional layers of the LED and the active device driver before performing etching steps and before adding the source metal, gate metal, drain metal and insulating layers to complete the nanowire light emitting switch device or array.

Further, the claimed technology has other advantages over prior technologies. By way of example, prior technologies have required the use of not only multiple layers, but also multiple materials in the light emitting and FET layers of the LED, combined with a multitude of metal layers that have resulted in added processing costs. In sharp contrast, examples of the claimed technology can rely on a one material system, GaN in this example, for the light emitting and FET layers, and with only three associated metal or other conductive layers. Removing the need for the additional layers and different materials required with prior multi-material systems with examples of the claimed technology substantially simplifies the design to decrease both the manufacturing cost and time. Additionally, examples of the claimed technology offer the potential for greater yields and a 100× improvement in resolution over prior technologies.

DETAILED DESCRIPTION

Figure 1A:
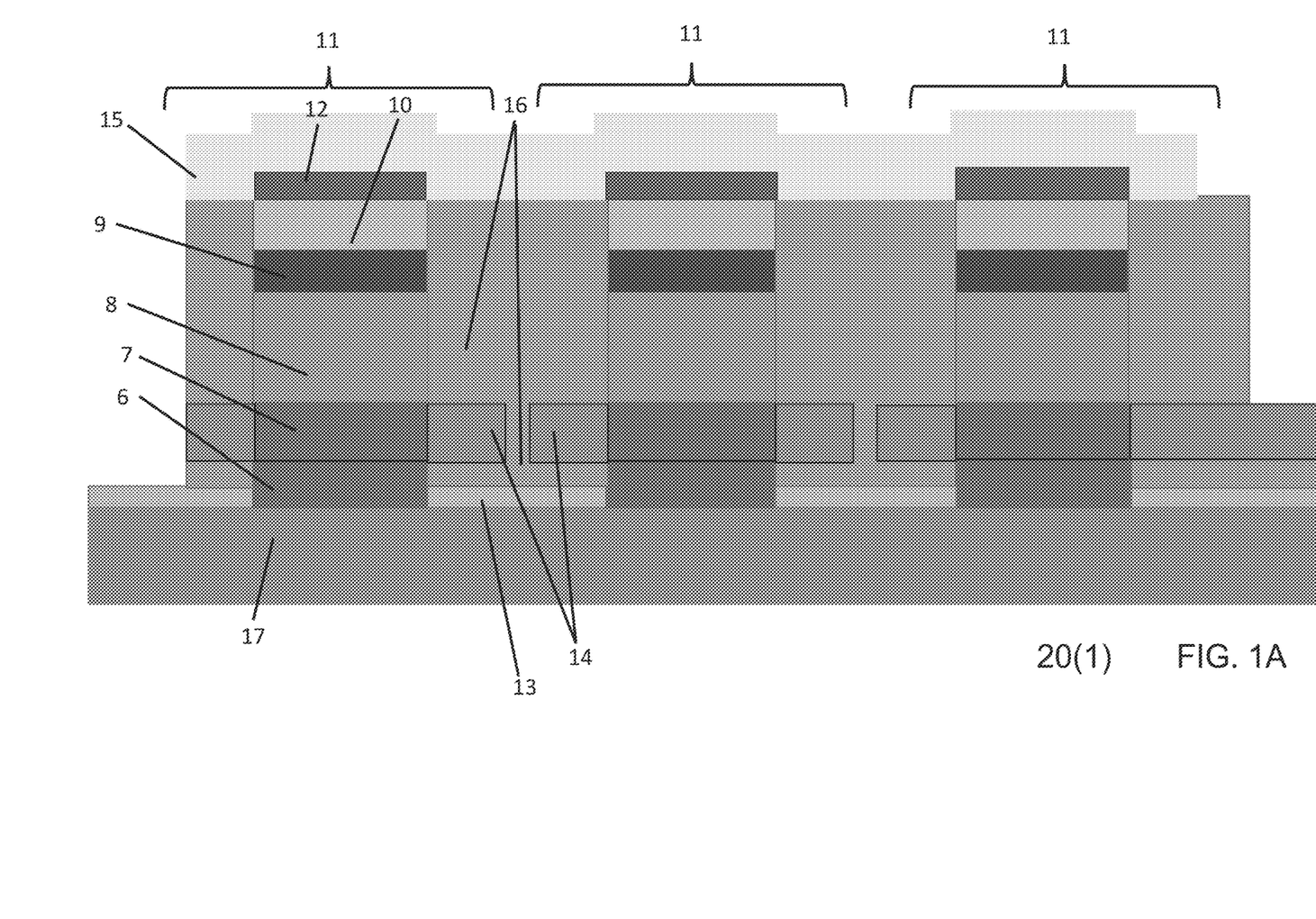
FIG. 1A is a cross-sectional view of an example of a nanowire array system with a plurality of nanowire light emitting switch devices.
Figure 1B:
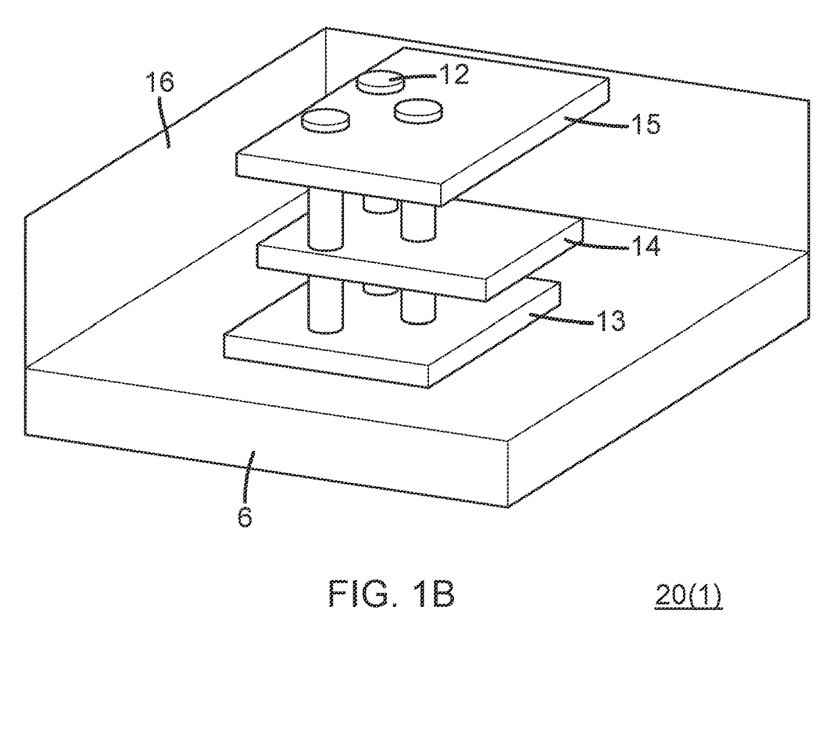
FIG. 1B is a partially cutaway and partially perspective view of a portion of the nanowire array system shown in FIG. 1A
Figure 1C:
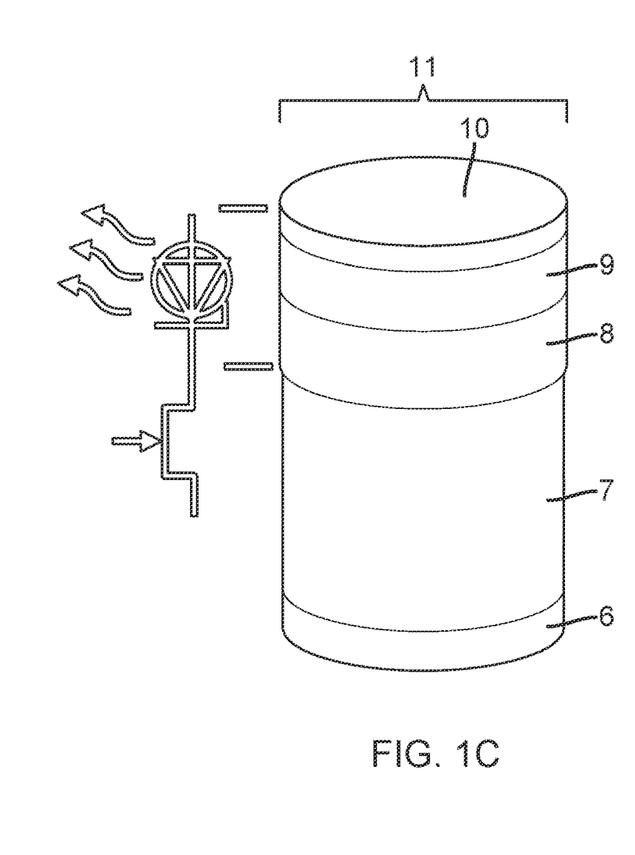
FIG. 1C is a perspective view of an example of one of the nanowire light emitting switch devices shown in FIGS. 1A-1B.

An example of a nanowire array system 20(1) is illustrated in FIGS. 1A-1C. The nanowire array system 20(1) includes a plurality of spaced apart nanowire light emitting switch devices 11, conductive layers 12, 13, and 14, insulating layers 16, and a substrate 17, although the system may include other types and/or numbers of systems, devices, components, layers, regions or other elements in other configurations. This technology provides a number of advantages including providing one or more energy efficient and reliable nanowire light emitting switch devices whose single axis oriented and integrated shared layer structure enables a high pixel density array to be easily fabricated.

Referring more specifically to FIGS. 1A-1B, in this example of the nanowire array system 20(1) the substrate 17 comprises a layer of $Al_2O_3$ (sapphire), although other types and/or numbers of substrates may be used, such as SiC (silicon carbide) substrate or silicon (Si) substrate by way of example only.

The conductive layers 12, 13, and 14 each comprise a metal layer, although each of the conductive layers may comprise other types and/or numbers of conductive layers and/or other materials. In this example, the conductive layer 12 forms a drain contact layer located on an end of each of the spaced apart nanowire light emitting switch devices 11, although other types and/or numbers of conductive layers in other configurations may be used. Additionally, in this example, the conductive layer 13 forms a source contact layer located adjacent another end of each of the spaced apart nanowire light emitting switch devices 11, although other types and/or numbers of conductive layers in other configurations may be used. Further, in this example, the conductive layer 14 forms a gate metal contact layer located around at least a portion of channel region 7 of each of the spaced apart nanowire light emitting switch devices 11, although other types and/or numbers of conductive layers in other configurations may be used.

A transparent conductive film (TCF) 15 comprises another conductive layer which may be formed to couple together one or more of the conductive layers 12 for one or more of the spaced apart nanowire light emitting switch devices 11, although other types and/or numbers of conductive layers in other configurations may be used. As illustrated in cross-sectional view in FIG. 1A, the spaced apart nanowire light emitting switch devices 11 may for example with the transparent conductive film (TCF) 15 couple three separate conductive layers 12 for three nanowire light emitting switch devices 11.

The size, density, and brightness of pixels in a pixel array formed in this example by the spacing of the light emitting switch devices 11, also referred to a nanowire structures or nanowires in examples herein, can also be changed by varying the widths of conducting layers 14 and conducting layers 15 to increase or decrease the number of light emitting switch devices 11 functioning as a single display pixel. FIG. 1B illustrates an example of multiple light emitting switch devices 11 that share conducting layers 14 and conducting layers 15.

A transparent insulator 16 is located between the conductive layer 13 and conductive layer 14 and between the conductive layer 13 and at least a portion of the transparent conductive film (TCF) 15 and about a corresponding portion of each of the spaced apart nanowire light emitting switch devices 11, although other types and/or numbers of insulating layers in other configurations may be used.

Referring more specifically to FIGS. 1A-1C, the spaced apart nanowire light emitting switch devices 11 each comprise light emitting diode (LED) layers 8, 9, and 10 and a field effect transistor (FET) or other device driver or switch comprising layers 6, 7, and 8, although each of the devices may comprise other types and/or numbers of other layers, regions, or other elements. In this example, the FET is coupled to control an operational state, i.e. an on state or an off state in this example, of the LED in each nanowire light emitting switch device 11, although other types of drivers or switches may be used. Additionally, in this example, the LED and the FET advantageously share a layer or other doped region 8 to help minimize lost space from prior positioning of the device driver or switch adjacent the LED taking up valuable real estate. Further, in this example the LED and the FET advantageously are each constructed to extend out from the substrate 17 along a single axis to enable a much more compact narrow design enabling closer spacing of the nanowire light emitting switch devices 11 so that much higher resolution can be achieved, although other configurations may be used.

Each pixel made by one or more of the light emitting switch devices 11 also can have the brightness modulated through the inclusion of the device driver which in this example is the FET of the light emitting switch devices 11. Brightness levels can for example be changed through electrical biases to conductive layer 14 and/or conductive layer 15.

The layer 6 of the field effect transistor (FET) or other device driver or switch is an electron rich source region for the FET that is grown or otherwise formed on the substrate 17, although other types of source regions may be used. In this particular example, the layer 6 is an unintentionally doped (u-GaN) buffer layer, although again other types of source regions may be used, such as an n-type GaN layer by way of example only. The u-GaN buffer layer 6 as the electron rich source region for the FET is possible due to the high electron concentration of $10^{17}$ cm$^{-3}$-$10^{20}$ cm$^{-3}$, from $O_2$ and defect incorporation.

The layer 7 of the field effect transistor (FET) or other device driver or switch is an electron deficient channel region for the FET that is grown or otherwise formed on the layer 6, although other types of channel regions may be used. In this particular example, the layer 7 is a thicker layer of u-GaN than the source region 6, although again other types of channel regions may be used, such as a p-type GaN layer. Use of this thicker u-GaN layer 7 as the electron deficient channel region for the FET is possible due to intrinsic nitrogen vacancies in the material, making the layer slightly n-type.

The layer 8 of the field effect transistor (FET) or other device driver or switch is an electron rich drain region for the FET that is grown or otherwise formed on the layer 7, although other types of source regions may be used. In this particular example, the layer 8 is an n-type GaN layer, although again other types of drain regions may be used.

This layer 8 is shared between the FET and LED of the nanowire light emitting switch device 11 and acts as an electron rich layer of the LED. In this particular example, the GaN layer for layer 8 comprises a cathode region of the LED and a drain region of the FET or other device driver.

The layer 9 is a multiple quantum well (MQW) region 9 with for example InGaN or AlGaN quantum wells and GaN or AlGaN barriers for the LED that efficiently generate light, although other types of layers and/or wells and other barriers may be used. More specifically, in this example light emission from the LED makes use of this layer 9 which is a multiple quantum well (MQW) region, where layers of Indium Gallium Nitride (InGaN) or Aluminum Gallium Nitride (AlGaN) are confined between layers of GaN or AlGaN in order to trap electron-hole pairs for the generation of light. In other examples, one or more other layers of material may be on layer 9 that alter a spectral emission. By way of a further example, one or more of the additional layers may comprise a color converter.

The layer 10 is a p-GaN region 10 or anode region for the LED, although again other types of regions and other configurations for the regions of the LED may be used. This layer 10 with layers 8 and 9 complete this example of the LED of each of the nanowire light emitting switch devices 11. Accordingly, in this example, the LED and FET are connected in series with a shared layer 8 and with the FET being able to switch the LED between "on" or "off" operational states.

As illustrated in the example above, each of the layers of the FET and LED may be advantageously formed from the same material, e.g. GaN based material, which reduces the number of materials required for manufacturing providing resulting efficiencies. Additionally, the GaN based material in the LED light emitting region and FET (driver or switch) is intrinsically transparent and, when combined with a select choice of one or more metals, the array system can be made optically transparent. This optical transparency enables examples of this technology to be used in a number of new applications, such as various different types of display technologies including for example augmented reality displays. This optical transparency and single axis oriented structure for the nanowire light emitting switch device 11 enables the generation of flexible display devices for use in wearable and otherwise curved electronics.

Referring to FIGS. 2A-2F, an example of a method of making the example of the nanowire array system is illustrated. As illustrated by way of the example below, fabrication of this integrated LED-FET device may employ fabrication techniques readily available in the semiconductor industry, allowing easy adoption of this technology. More specifically, examples of the claimed technology may make use of conventionally grown LED layers, using a metal organic chemical vapor deposition (MOCVD) tool in wide commercial use.

Figure 2A:
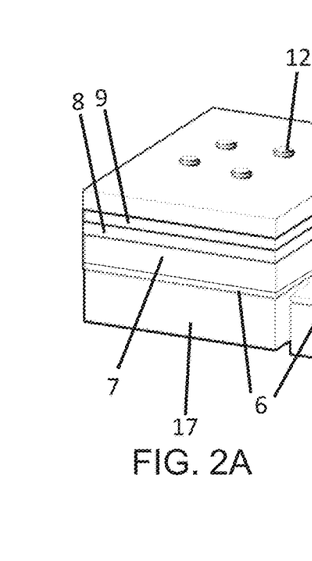
FIGS. 2A-2F are perspective views of an example of a method of making an example of the nanowire array system.

Referring more specifically to FIG. 2A, first an electron rich source layer or region 6 is grown on the substrate 17, which again could in these examples be either an unintentionally doped (u-GaN) buffer layer or an n-type GaN layer. As discussed earlier, use of a u-GaN buffer layer is possible due to the high Electron concentration of $10^{17}$ cm$^{-3}$-$10^{20}$ cm$^{-3}$, from O$_2$ and defect incorporation. Additionally, in this example the substrate 17 is Al$_2$O$_3$ (sapphire), although in other types of substrates may be used, such as a SiC (silicon carbide) substrate or a silicon (Si) substrate.

Next an electron deficient channel layer or region 7 is grown on layer or region 6 which again can be a thicker layer of u-GaN than used for layer or region 6 or a p-type GaN layer. Use of a thicker u-GaN layer as the electron deficient channel region 7 is possible due to intrinsic nitrogen vacancies in the material, making the layer slightly n-type.

Next, the electron rich layer 8 is grown or otherwise formed on the layer 7. The bottom electron rich source region 6, the electron deficient channel region 7, and the n-GaN drain region 8 create the required structure for this example of a FET for each of the nanowire light emitting switch devices 11. As discussed below, this layer 8 is shared by the FET with the LED of this example of the nanowire light emitting switch devices 11.

Next, to form the LED comprising layers 8, 9, and 10 for this example of each of the nanowire light emitting switch devices 11, a multiple quantum well (MQW) region 9 with InGaN or AlGaN quantum wells and GaN or AlGaN barriers that efficiently generate light is formed on the shared layer or region 8.

Next, a p-GaN region 10 is formed on the multiple quantum well (MQW) region 9 for the LED for 10 for this example of each of the nanowire light emitting switch devices 11. Accordingly, in this example, the LED comprising layers 8, 9, and 10 and the FET comprising layers 6, 7, and 8 are connected in series with a shared layer 8 and with the FET coupled to be able to switch the LED between "on" or "off" operational states. The shared electron rich initial layer again functions both as the cathode for the LED and the drain region for the FET for each of the nanowire light emitting switch devices 11 in this example.

Figure 2B:
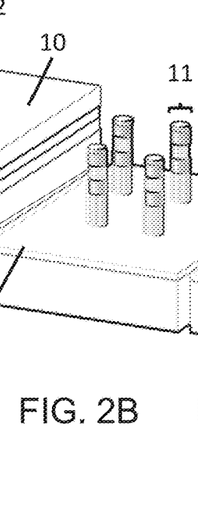

Next, an exposed surface of the p-GaN layer 10 may be patterned through a metal lift-off process to deposit Ni or other conductive material, which both acts as the ohmic p-type GaN contact for layer or region 12 and as the hard mask for the chlorine based dry etch as shown in FIG. 2A-2B. The nanowires 11 can then undergo an optional anneal in O$_2$ to create NiO for a more ohmic contact to the p-GaN layer or region 12.

Next, the chlorine based dry etch can be used in order to selectively remove material to leave nanowire light emitting switch devices 11 which each extend along a single axis out from the substrate 17 as shown in FIG. 2B.

Figure 2C:
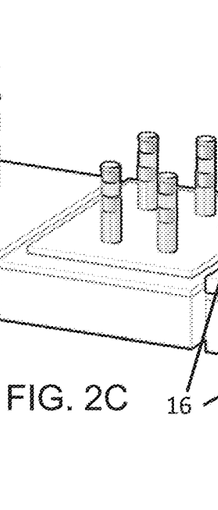

Next a Ti based or other conductive material metallization is thermally evaporated, coating just the tips of the nanowire light emitting switch devices 11 and base as shown in FIG. 2C. An optional anneal may then be performed to generate TiN from the metal, further increasing the n-type nature of the u-GaN buffer layer or region 6.

Figure 2D:
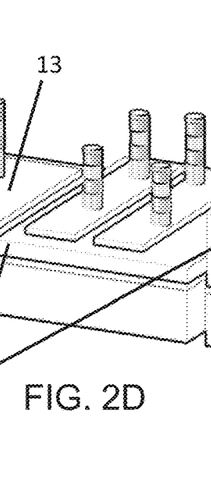

After the metal deposition a transparent insulator 16 is then coated and etched back to uncover everything above the upper boundary of the electron rich source region or layer 6 as shown in FIG. 2D. The insulator 16 acts as a spacer to separate the metal or conductive layers 13 and 14 from each other.

Next, lines of metal for the gate layer 14 are then patterned with a lift-off process. Metals, such as Ni are thermally evaporated coating the tops of the nanowire light emitting switch devices 11 with the conductive layer or wire 12 and the insulator 16, forming the layer 14 comprising a gate-all-around coupling to the u-GaN region as shown in FIG. 2D. Accordingly, examples of the claimed technology may wrap the gate around at least a portion of the channel region or layer 7 of each of the nanowire light emitting switch devices 11 which provides fast switching and lowers power consumption when in an "off" operational state.

Figure 2E:
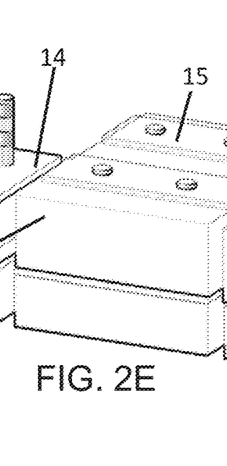

Next, more optically transparent insulation 16 may then be coated and etched back to reveal just the tips of the wires 12. Lift-off may again be used to pattern lines of a transparent conductive film (TCF) 15 to form the top interconnects 15 as shown in FIG. 2E.

Figure 2F:
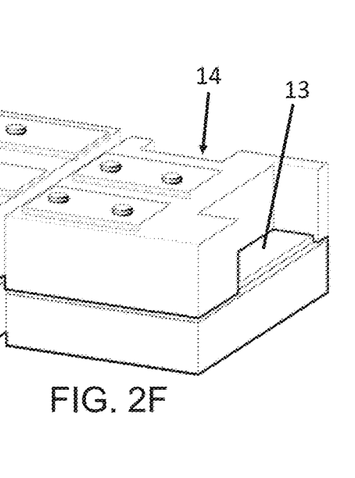

As a final step, the insulator 16 may be selectively etched away to expose the buried metal or conductive layers 13 and 14 for external connection as shown in FIG. 2F.

A variety of alternative choices may be used with each of these steps, such as using choices for the gate metal or conductive layer 14 besides Ni by way of example only. In other examples, a gate insulator along the nanowire sides may be alternatively integrated. One of the advantages of this method is that this layer by layer fabrication enables precise control over and customization of the final design and layout. Another advantage as noted earlier is this technology is able to utilize existing fabrication methodologies.

The device layout illustrated in this particular layout creates a cross design in order to selectively address individual nanowires 11 for display purposes. In this example, the source metal or conductive layer 13 is common to all nanowires, acting as a common ground connection, while the gate metal or conductive layer 14 and drain metal or conductive layer 15 are alternatively addressed in rows and columns.

An example of a method for operating one of the nanowire light emitting switch devices 11 in a nanowire array system will now be described with reference to FIGS. 1A-1C. When the gate layer 14 of the FET the nanowire light emitting switch devices 11 is energized, then electrons flow from the source region 6 through the channel region 7 into the shared drain region 8 to turn the FET and LED to an "on" operational state. From the shared drain region 8, the electrons flow through the LED to recombine with holes in the MQW region 9 to produce light. The drain contact layer 8 forward biases the LED 8-10 that is in series with the FET 6-8 allowing for a positive source to drain bias for FET operation.

Figure 3:
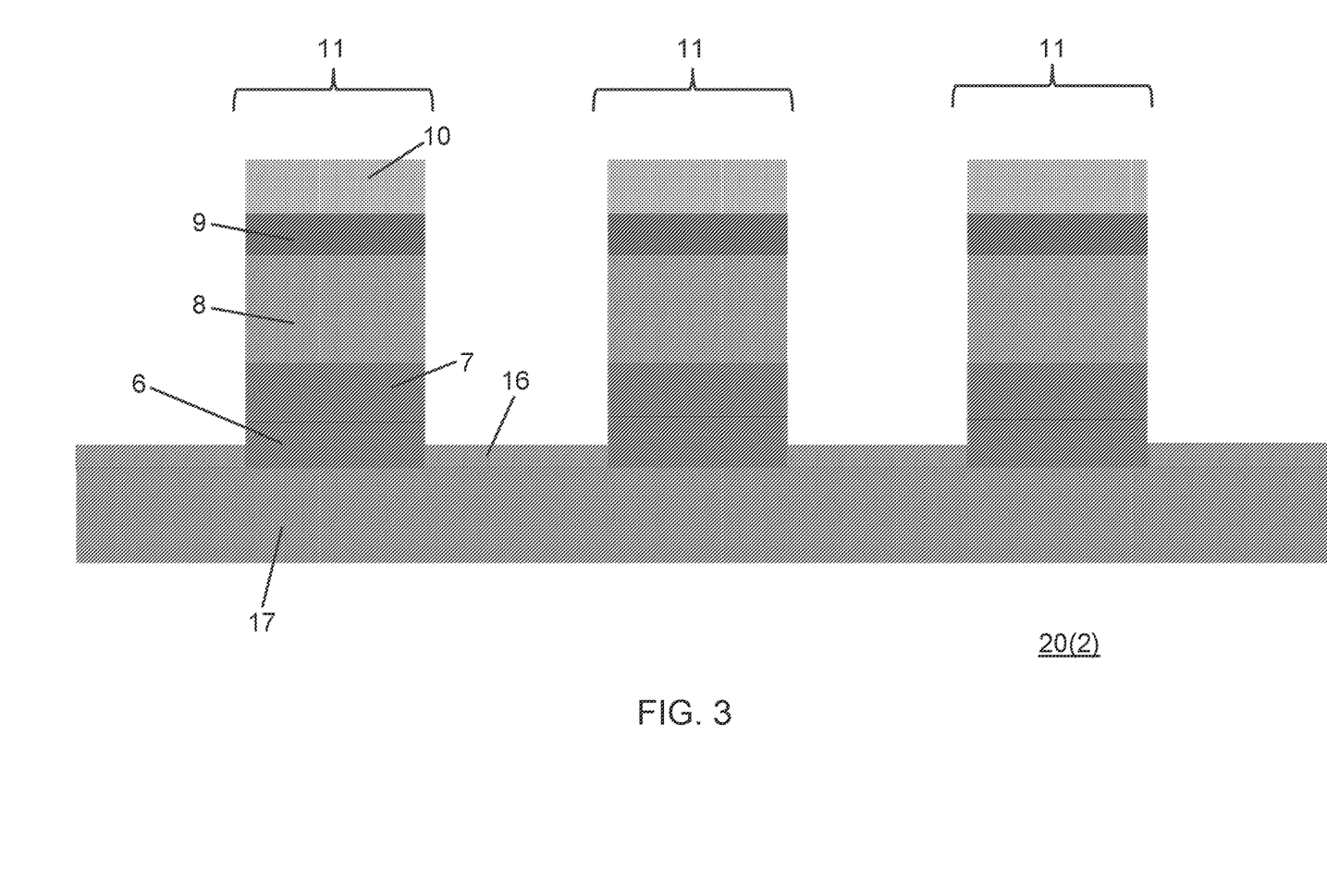
FIG. 3 is a cross-sectional view of another example of the nanowire array system illustrating another fabrication technique.

Referring to FIG. 3, an alternative method of fabricating nanowire light emitting switch devices 11 in a nanowire array system 20(2) is shown. This method is the same as illustrated and described with reference to FIGS. 2A-2F except as otherwise illustrated or described by way of the examples herein. In this example, this method of fabrication utilizes a bottom-up growth technique through use of an insulating layer 16 for selective area growth. Selective area growth of the nanowire light emitting switch devices 11 can allow for separate growths to occur to create nanowire light emitting switch devices 11 that each emit distinct colors. Variations in the opening size of the insulating layer 16 can be used with a single growth process in order to create as-grown nanowire light emitting switch devices 11 which emit distinct colors.

Figure 4:
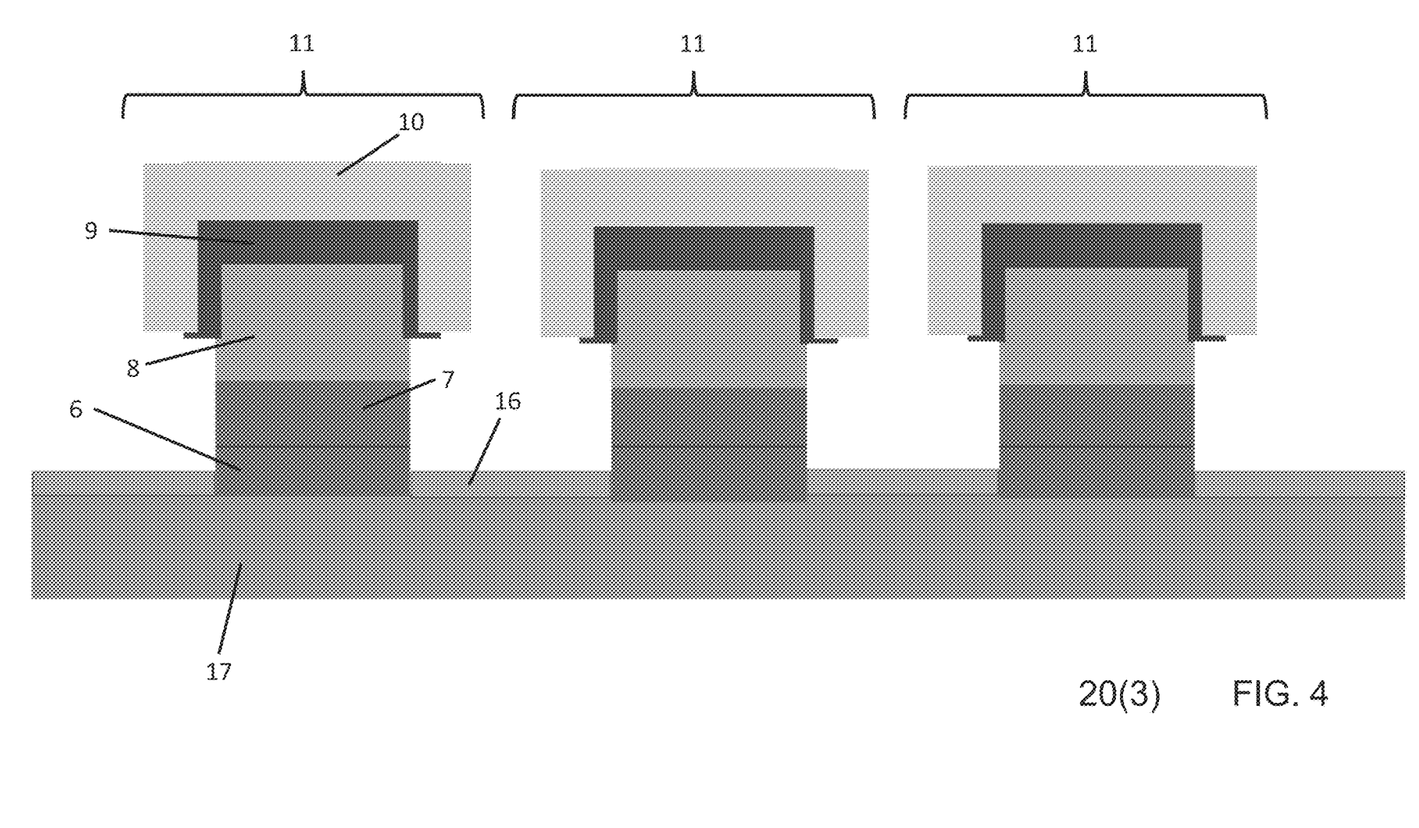
FIG. 4 is a cross-sectional view of yet another example of the nanowire array system illustrating yet another fabrication technique.

Referring to FIG. 4, an alternative method of fabricating nanowire light emitting switch devices 11 in a nanowire array system 20(3) is shown. This method is the same as illustrated and described with reference to FIGS. 2A-2F except as otherwise illustrated or described by way of the examples herein. In this example, this method of fabrication, the MQW region 9 and p-type region 10 of the grown LED can wrap around a portion of shared n-GaN region 8.

As illustrated and described by way of the examples herein, examples of the claimed technology may be utilized for a variety of different types of application. For example, the claimed technology can be used for a variety of different types of display technologies from smart watches, to TVs, to phones. The nanowire light emitting switch devices 11, each being the individual pixels, can be advantageously spaced to provide much higher resolution.

In other examples, the claimed technology can be used to replace typical display technology, due to the transparent nature discussed earlier. As a result, examples of the claimed technology work exceedingly well in creating heads-up display technology. Additionally, by way of another example, current heads-up displays rely on a bulky projector, where examples of this claimed technology would eliminate this need. The display made from examples of this claimed technology would be the transparent eyepiece itself without the need for any projectors.

In yet other examples, the nanowire nature of the nanowire light emitting switch devices 11 allows for flexibility which opens up other opportunities relating to flexible displays. In particular, the wire structure of the nanowire light emitting switch devices 11 allows them to tolerate the stress of flexing and mechanical motion.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A nanowire system comprising:
   a substrate;
   at least one nanowire structure which extends out along an axis from a surface of the substrate, the nanowire structure comprising:
   a light emitting diode; and
   a device driver electrically coupled to the light emitting diode to control an operational state of the light emitting diode;
   wherein a cathode region of the light emitting diode and a drain region of the device driver are integrated to each share at least one doped region and that comprises an electron rich drain region for the device driver, an anode region of the light emitting diode is electrically coupled to the at least one doped region, and an electron deficient channel region of the device driver is electrically coupled between an electron rich source region and the at least one doped region.

2. The system as set forth in claim 1 wherein the shared at least one doped region comprises a GaN layer.

3. The system as set forth in claim 2 wherein the anode region is electrically coupled to the GaN layer that comprises the cathode region and the channel region is electrically coupled between the source region and the GaN layer that comprises the drain region.

4. The system as set forth in claim 3 wherein the source region and the channel region each comprise another GaN layer.

5. The system as set forth in claim 2 wherein the cathode region of the light emitting diode and the drain region of the device driver share a common external connectivity.

6. The system as set forth in claim 1 wherein a maximum cross sectional dimension of the at least one nanowire structure is less than about 10 microns.

7. The system as set forth in claim 1 wherein a maximum cross sectional dimension of the at least one nanowire structure is less than about 3 microns.

8. The system as set forth in claim 1 further comprising a Ni-based metal drain contact and a Ti-based metal layer adjacent to and electrically connected to the source region.

9. The system as set forth in claim 1 wherein the light emitting diode further comprises one or more layers of material on a light emitting portion of the light emitting diode that alter a spectral emission.

10. The system as set forth in claim 9, wherein the one or more layers comprises a color converter.

11. A nanowire system comprising
a substrate;
at least one nanowire structure which extends out along an axis from a surface of the substrate, the nanowire structure comprising:
a light emitting diode;
a device driver electrically coupled to the light emitting diode to control an operational state of the light emitting diode;
wherein a cathode region of the light emitting diode and a drain region of the device driver are integrated to each share at least one doped region, an anode region of the light emitting diode is electrically coupled to the at least one doped region, and a channel region of the device driver is electrically coupled between a source region and the at least one doped region; and
a gate metal layer electrically coupled to at least a portion of a periphery of the channel region of the device driver.

12. A nanowire system comprising:
a substrate;
two or more nanowire structures which each extend out along a separate axis from a surface of the substrate, each of the nanowire structures comprising:
a light emitting diode;
a device driver electrically coupled to the light emitting diode to control an operational state of the light emitting diode, wherein a cathode region of the light emitting diode and a drain region of the device driver are integrated to each share at least one doped region and wherein a source region of the device driver for two or more of the nanostructures is a shared source region; and
a gate metal layer electrically coupled with a channel region of two or more nanowire structures.

13. The system as set forth in claim 12 further comprising a transparent conductive film layer that electrically couples together a plurality of adjacent nanowire structures.

14. The system as set forth in claim 13, wherein the plurality of adjacent nanowire structures is electrically coupled by both the transparent conductive film layer and the gate metal layer.

* * * * *